US010454449B2

(12) United States Patent
Mimura

(10) Patent No.: US 10,454,449 B2
(45) Date of Patent: Oct. 22, 2019

(54) ELASTIC WAVE DEVICE

(71) Applicant: Murata Manufacturing Co., Ltd., Nagaokakyo-shi, Kyoto-fu (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 403 days.

(21) Appl. No.: 15/373,553

(22) Filed: Dec. 9, 2016

(65) Prior Publication Data

US 2017/0093367 A1  Mar. 30, 2017

Related U.S. Application Data

(63) Continuation of application No. PCT/JP2015/067119, filed on Jun. 15, 2015.

(30) Foreign Application Priority Data

Jun. 23, 2014  (JP) ................................ 2014-128258

(51) Int. Cl.
  *H03H 9/145*  (2006.01)
  *H03H 9/17*  (2006.01)
  *H03H 9/25*  (2006.01)
  *H03H 9/02*  (2006.01)

(52) U.S. Cl.
  CPC .... *H03H 9/14544* (2013.01); *H03H 9/02858* (2013.01); *H03H 9/17* (2013.01); *H03H 9/25* (2013.01)

(58) Field of Classification Search
  CPC combination set(s) only.
  See application file for complete search history.

(56) References Cited

U.S. PATENT DOCUMENTS 8,294,331 B2 * 10/2012 Abbott .............. H03H 9/02858
                                              29/25.35
2001/0010484 A1 * 8/2001 Nakamura .......... H03H 9/0028
                                              333/195

(Continued)

FOREIGN PATENT DOCUMENTS

JP       47-6737 U    9/1972
JP      3166235 B2    3/2001

(Continued)

OTHER PUBLICATIONS

Official Communication issued in corresponding International Application PCT/JP2015/067119, dated Aug. 11, 2015.

(Continued)

*Primary Examiner* — Bryan P Gordon
(74) *Attorney, Agent, or Firm* — Keating & Bennett, LLP

(57) ABSTRACT

In an elastic wave device, low acoustic velocity portions are provided on both sides of an IDT center portion in an intersection region of an IDT electrode and high acoustic velocity portions are provided outside of the low acoustic velocity portions in an electrode finger direction. Thus, a piston mode is able to be utilized. The widths of the high acoustic velocity portions in end portions of the IDT electrode in an elastic wave propagation direction are relatively smaller than the widths of the high acoustic velocity portions in the center of the IDT electrode in the elastic wave propagation direction.

17 Claims, 8 Drawing Sheets

(56) References Cited

U.S. PATENT DOCUMENTS

| | | | |
|---|---|---|---|
| 2009/0295507 A1* | 12/2009 | Kando | H03H 9/0071 |
| | | | 333/193 |
| 2010/0237963 A1 | 9/2010 | Takamine | |
| 2011/0068655 A1 | 3/2011 | Solal et al. | |
| 2012/0025931 A1 | 2/2012 | Yamamoto et al. | |
| 2013/0051588 A1* | 2/2013 | Ruile | H03H 3/08 |
| | | | 381/190 |
| 2014/0015624 A1 | 1/2014 | Kishino | |
| 2015/0282324 A1* | 10/2015 | Miyawaki | H05K 1/0284 |
| | | | 361/775 |
| 2017/0047905 A1* | 2/2017 | Araki | H03H 9/02535 |

FOREIGN PATENT DOCUMENTS

| | | |
|---|---|---|
| JP | 2011-101350 A | 5/2011 |
| JP | 2013-518455 A | 5/2013 |
| KR | 10-2010-0089868 A | 8/2010 |
| WO | 2010/116995 A1 | 10/2010 |
| WO | 2012/132877 A1 | 10/2012 |

OTHER PUBLICATIONS

Omori et al., "Suppression of Spurious Responses for Ultra-Wideband and Low-Loss SAW Ladder Filter on a Cu-grating/15° YX-LinbO3 Structure", IEEE Ultrasonics Symposium, 2006, pp. 1874-1877.

* cited by examiner

ELASTIC WAVE DEVICE

CROSS REFERENCE TO RELATED APPLICATIONS

This application claims the benefit of priority to Japanese Patent Application No. 2014-128258 filed on Jun. 23, 2014 and is a Continuation Application of PCT Application No. PCT/JP2015/067119 filed on Jun. 15, 2015. The entire contents of each application are hereby incorporated herein by reference.

BACKGROUND OF THE INVENTION

1. Field of the Invention

The present invention relates to an elastic wave device in which an IDT electrode is located on a piezoelectric substrate, and in particular, relates to an elastic wave device that utilizes a piston mode.

2. Description of the Related Art

In the related art, surface acoustic wave devices are known that utilize a so-called piston mode. For example, in Japanese Unexamined Patent Application Publication No. 2011-101350 and Japanese Unexamined Patent Application Publication No. 2013-518455, low acoustic velocity portions are provided on both sides of the center of an IDT electrode in an electrode finger direction, which is a direction in which electrode fingers of the IDT electrode extend, and high acoustic velocity portions are provided on both sides of the low acoustic velocity portions in the electrode finger direction. The low acoustic velocity portions are formed by increasing the width of the electrode fingers or by stacked a mass-adding film, which causes a fall in acceleration, on the electrode fingers. The high acoustic velocity portions are parts where only electrode fingers that are connected to one busbar are arranged in an elastic wave propagation direction. That is, the high acoustic velocity portions are provided outside of an intersection width region in the electrode finger direction. In Japanese Unexamined Patent Application Publication No. 2011-101350, the width, i.e., the dimension in the electrode finger direction, of the high acoustic velocity portions, is at least 1λ and is preferably 3λ or higher.

The intersection width of a surface acoustic wave resonator is at least 10λ, where λ is the wavelength of a surface acoustic wave. As described above, in Japanese Unexamined Patent Application Publication No. 2011-101350, the width of a high acoustic velocity portion is at least 1λ on each side. Therefore, high acoustic velocity portions of such a width have to be provided on both sides of the intersection width region in the electrode finger direction. Therefore, the area of the part of the IDT electrode located inside of the busbars is increased. Therefore, it is difficult to make progress in size reduction.

SUMMARY OF THE INVENTION

Preferred embodiments of the present invention provide an elastic wave device that utilizes a piston mode and achieves size reduction.

An elastic wave device according to a preferred embodiment of the present invention includes a piezoelectric substrate; and an IDT electrode provided on the piezoelectric substrate; wherein the IDT electrode includes a plurality of first electrode fingers and a plurality of second electrode fingers that are inserted between the plurality of first electrode fingers, low acoustic velocity portions, in which an acoustic velocity of a propagating elastic wave is lower than in a center region in an electrode finger direction which is a direction in which the pluralities of first and second electrode fingers extend, are provided on both sides of the center region in the electrode finger direction and high acoustic velocity portions, in which an acoustic velocity of a propagating elastic wave is higher than in the central region, are located closer to an outside than the low acoustic velocity portions in the electrode finger direction, and when a width of the high acoustic velocity portions is a dimension of the high acoustic velocity portions in the electrode finger direction, the widths of the high acoustic velocity portions in end portions of the IDT electrode in an elastic wave propagation direction is relatively smaller than the widths of the high acoustic velocity portions in a center of the IDT electrode in the elastic wave propagation direction.

In a certain specific aspect of an elastic wave device according to a preferred embodiment of the present invention, there is a portion where the width of the high acoustic velocity portions is constant in the center of the IDT electrode in the elastic wave propagation direction.

In another specific aspect of an elastic wave device according to a preferred embodiment of the present invention, the width of the high acoustic velocity portions gradually decreases in a direction from the center of the IDT electrode in the elastic wave propagation direction toward the end portions of the IDT electrode in the elastic wave propagation direction.

In another specific aspect of an elastic wave device according to a preferred embodiment of the present invention, the width of the high acoustic velocity portions in the end portions of the IDT electrode in the elastic wave propagation direction is at least about 0.3 times the width of the high acoustic velocity portions in the center of the IDT electrode in the elastic wave propagation direction.

In another specific aspect of an elastic wave device according to a preferred embodiment of the present invention, the low acoustic velocity portions include large-width portions in which the width of the electrode fingers is larger than in the center region.

In another specific aspect of an elastic wave device according to a preferred embodiment of the present invention, the low acoustic velocity portions include a mass-adding film on the first and second electrode fingers.

In another specific aspect of an elastic wave device according to a preferred embodiment of the present invention, in the IDT electrode, a first busbar is electrically connected to the plurality of first electrode fingers, a second busbar is electrically connected to the plurality of second electrode fingers, and a region located between an intersection region, in which the first and second electrode fingers overlap in the elastic wave propagation direction, and the first busbar, and a region located between the intersection region and the second busbar constitute the high acoustic velocity portions.

In another specific aspect of an elastic wave device according to a preferred embodiment of the present invention, the high acoustic velocity portions include openings in the busbars.

In a certain specific aspect of an elastic wave device according to a preferred embodiment of the present invention, the busbars each include an inner busbar portion that is located closer to the center in an intersection width direction than the portion of the busbar where the opening is provided, and the inner busbar portion defines the low acoustic velocity portion.

In an elastic wave device according to a preferred embodiment of the present invention, the width of the high acoustic velocity portions in end portions of the IDT electrode in the elastic wave propagation direction is smaller than the width of the high acoustic velocity portions in the center of the IDT electrode in the elastic wave propagation direction and therefore the area of the IDT electrode is reduced by a corresponding amount. Therefore, progress is able to be made in reducing the size of the elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
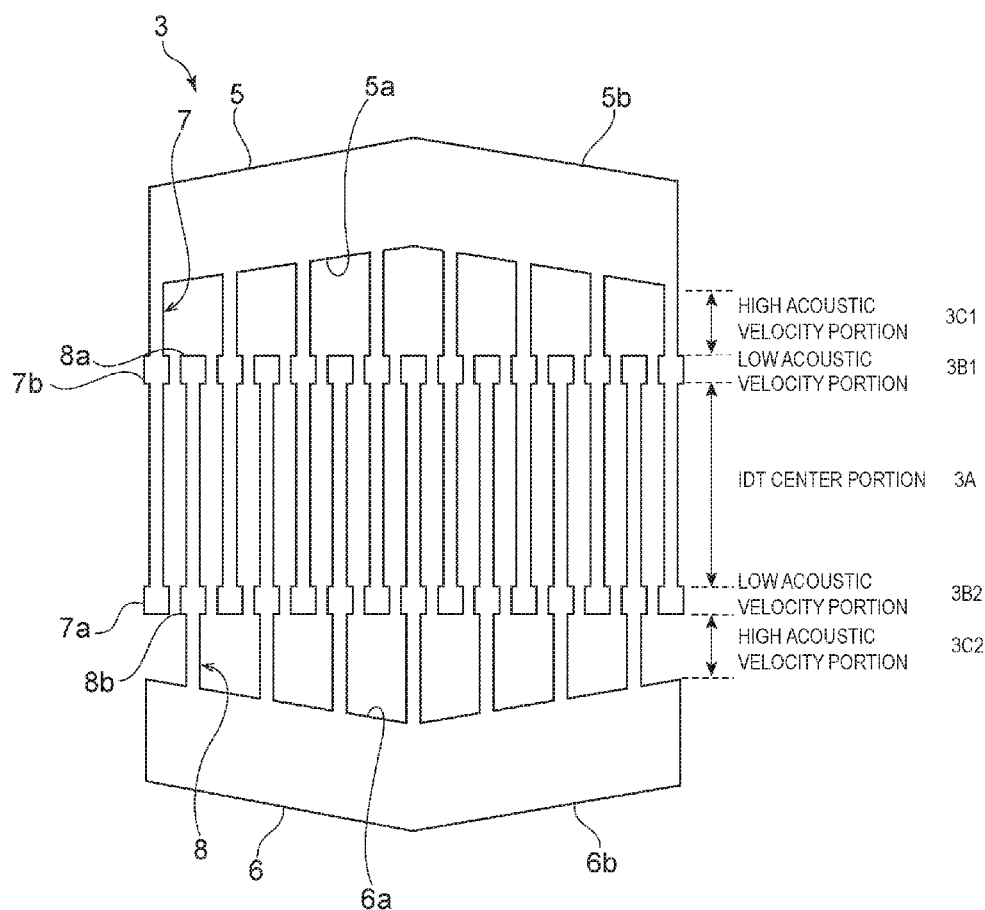
FIG. 1A is a schematic plan view illustrating an IDT electrode of an elastic wave device of a first preferred embodiment of the present invention and FIG. 1B is a schematic plan view of the elastic wave device of the first preferred embodiment of the present invention.

Hereafter, the present invention will be made clearer by describing specific preferred embodiments of the present invention while referring to the drawings.

Figure 1B:
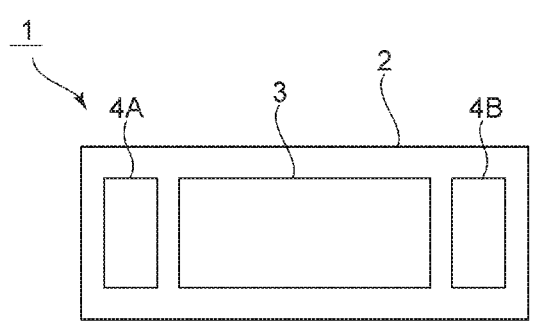

FIG. 1A is a schematic plan view illustrating an IDT electrode of an elastic wave device of a first preferred embodiment of the present invention and FIG. 1B is a schematic plan view of the elastic wave device of the first preferred embodiment of the present invention.

As illustrated in FIG. 1B, an elastic wave device 1 includes a piezoelectric substrate 2. The piezoelectric substrate 2 preferably includes a piezoelectric single crystal such as $LiTaO_3$ or $LiNbO_3$. The piezoelectric substrate 2 may include a piezoelectric ceramic.

An IDT electrode 3 is provided on the piezoelectric substrate 2, the position of the IDT electrode 3 being schematically illustrated. Reflectors 4A and 4B are provided on both sides of the IDT electrode 3 in an elastic wave propagation direction. In FIG. 1B, only the positions at which the reflectors 4A and 4B are provided are schematically illustrated.

FIG. 1A is a schematic plan view that illustrates the IDT electrode 3 in an enlarged manner. The IDT electrode 3 includes a first busbar 5 and a second busbar 6. The first busbar 5 and the second busbar 6 face each other in an electrode finger direction that is perpendicular or substantially perpendicular to the elastic wave propagation direction.

A plurality of first electrode fingers 7 are connected to the first busbar 5. The first electrode fingers 7 extend toward the second busbar 6. A plurality of second electrode fingers 8 are connected to the second busbar 6. The second electrode fingers 8 extend toward the first busbar 5. The plurality of first electrode fingers 7 and the plurality of second electrode fingers 8 extend parallel or substantially parallel to each other. The direction in which the first electrode fingers 7 and the second electrode fingers 8 extend is the electrode finger direction. The elastic wave propagation direction is a direction that is perpendicular or substantially perpendicular to the electrode finger direction.

A portion where the plurality of first electrode fingers 7 and the plurality of second electrode fingers 8 overlap when viewed in the elastic wave propagation direction is an intersection region. A dimension of the intersection region in the electrode finger direction is an intersection width.

When a voltage is applied to adjacent electrode fingers in the intersection region, an elastic wave is excited by the piezoelectric effect. Incidentally, large-width portions 7a are provided at the tips of the first electrode fingers 7 of the IDT electrode 3. Large-width portions 8a are also provided at the tips of the second electrode fingers 8. In addition, large-width portions 7b are provided in the first electrode fingers 7 in regions that overlap the large-width portions 8a in the elastic wave propagation direction. Similarly, large-width portions 8b are also provided in the second electrode fingers 8 at positions that overlap the large-width portions 7a in the elastic wave propagation direction. The large-width portions 7a and 7b have a larger width, that is, dimension in the elastic wave propagation direction, than the other portions of the first electrode fingers 7. The large-width portions 8a and 8b also have a larger width than the other portions of the second electrode fingers 8. The dimension of the large-width portions 7a and 7b in the electrode finger direction and the dimension of the large-width portions 8a and 8b in the electrode finger direction are not especially limited, but they are preferably the same as each other. The width of the large-width portions 7a and 7b and the width of the large-width portions 8a and 8b are also not especially limited, but are preferably the same as each other.

The propagation velocity of an elastic wave is retarded in the regions where the large-width portions 7a, 7b, 8a and 8b are provided. That is, in the intersection region, an IDT center portion 3A is provided as a center region and low acoustic velocity portions 3B1 and 3B2 are provided on both sides of the IDT center portion 3A in the electrode finger direction, as illustrated in FIG. 1A. In the intersection region, the velocity of an elastic wave propagating through the low acoustic velocity portions 3B1 and 3B2 is lower than the velocity of an elastic wave propagating through the IDT center portion 3A.

High acoustic velocity portions 3C1 and 3C2 are provided outside the low acoustic velocity portions 3B1 and 3B2 in the electrode finger direction. In the high acoustic velocity portion 3C1, only the plurality of first electrode fingers 7 exist in the elastic wave propagation direction. In the high acoustic velocity portion 3C2, only the plurality of second electrode fingers 8 exist in the elastic wave propagation direction.

Figure 2:
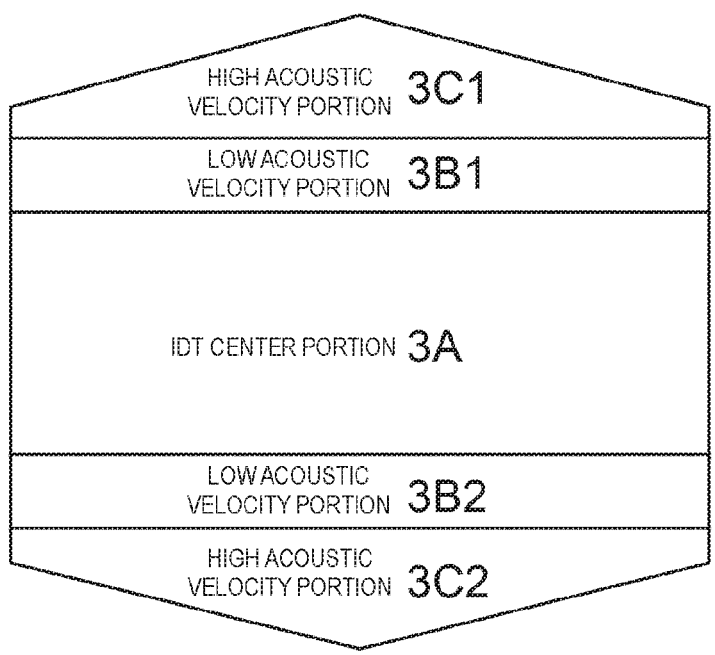
FIG. 2 is a schematic plan view illustrating the arrangement of respective acoustic velocity portions of the IDT electrode of the first preferred embodiment of the present invention.

Therefore, as schematically illustrated in FIG. 2, the low acoustic velocity portions 3B1 and 3B2 are provided on both sides of the IDT center portion 3A in the electrode finger direction and the high acoustic velocity portions 3C1 and 3C2 are additionally provided outside the low acoustic velocity portions 3B1 and 3B2 in the electrode finger direction in the IDT electrode 3. Therefore, similarly to the elastic wave devices described in Japanese Unexamined Patent Application Publication No. 2011-101350 and Japanese Unexamined Patent Application Publication No. 2013-518455, spurious due to a transverse mode can be reduced by utilizing the piston mode.

In addition, in this preferred embodiment, the width, that is, the dimension in the electrode finger direction, of the high acoustic velocity portions 3C1 and 3C2 of the IDT electrode 3 is not uniform in the elastic wave propagation direction in the IDT electrode 3. More specifically, the width of the high acoustic velocity portion 3C1 gradually becomes smaller in a direction from the center of the IDT electrode 3 in the elastic wave propagation direction toward the two ends of the IDT electrode 3 in the elastic wave propagation direction. Taking the high acoustic velocity portion 3C1 as an example, an inner lateral edge 5a of the first busbar 5 is inclined so as to become closer to the second busbar 6 as one moves from the center of the IDT electrode 3 in the elastic wave propagation direction toward the end portions of the IDT electrode 3 in the elastic wave propagation direction. Therefore, the width of the high acoustic velocity portion 3C1 gradually becomes smaller as one moves from the center of the IDT electrode 3 toward the outside in the elastic wave propagation direction. The same is true for the high acoustic velocity portion 3C2. An inner lateral edge 6a of the second busbar 6 is inclined so as to become closer to the first busbar 5 as one moves from the center toward the two end portions in the elastic wave propagation direction. Therefore, the width of the high acoustic velocity portion 3C2 also becomes smaller as one moves from the center toward the end portions in the elastic wave propagation direction.

Therefore, the dimension of the IDT electrode 3 in the electrode finger direction is able to be reduced by positioning outer lateral edges 5b and 6b of the first and second busbars 5 and 6 to be parallel or substantially parallel to the inner lateral edges 5a and 6a of the first and second busbars 5 and 6. In more detail, the dimension of the IDT electrode 3 in the electrode finger direction is able to be made smaller at both ends in the elastic wave propagation direction than in the center of the IDT electrode 3 in the elastic wave propagation direction. Therefore, the IDT electrode 3 is able to be reduced in size or the electrode formation space on the piezoelectric substrate 2 is able to be reduced in size and consequently the elastic wave device 1 is able to be made smaller.

Reflectors 4A and 4B illustrated in FIG. 1B are defined by well-known grating reflectors. The electrode finger direction dimensions of end portions of the reflectors 4A and 4B next to the IDT electrode 3 can also be made smaller in accordance with the electrode finger direction dimension of the end portions of the IDT electrode 3 in the elastic wave propagation direction. Thus, the elastic wave device 1 is able to be reduced in size.

The IDT electrode 3 and the reflectors 4A and 4B are able to be made of a suitable metal or alloy. In addition, the IDT electrode 3 and the reflectors 4A and 4B may be provided by using a multilayer metal film formed by stacking a plurality of metal films.

The elastic wave device 1 of this preferred embodiment is able to utilize the piston mode and realize a reduction in the size of the elastic wave device, as described above. Furthermore, as described above, even though the width of the high acoustic velocity portions 3C1 and 3C2 is smaller at end portions of the IDT electrode 3 in the elastic wave propagation direction, loss does not become worse. This will be described in more detail below.

Figure 3:
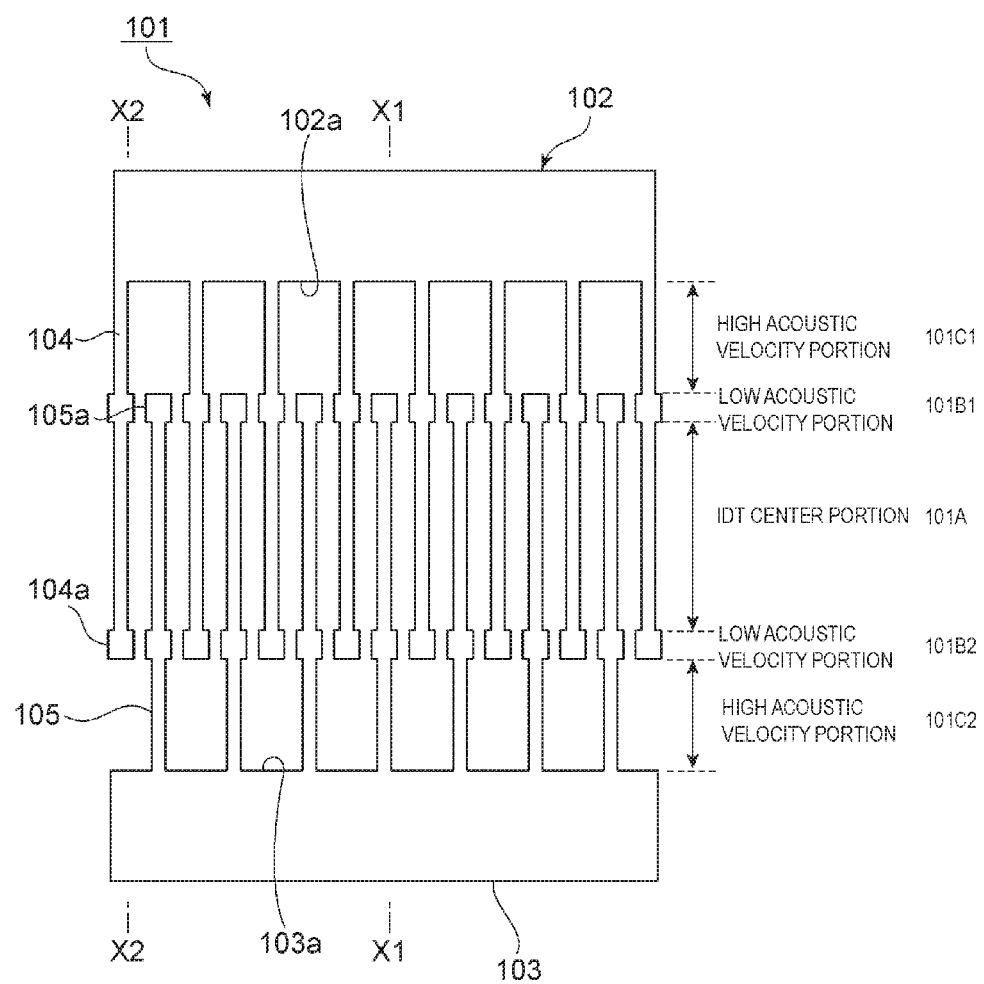
FIG. 3 is a schematic plan view illustrating the main portion of an IDT electrode of an elastic wave device of the related art that utilizes a piston mode.

FIG. 3 is a schematic plan view illustrating a main portion of an IDT electrode of an elastic wave device that utilizes a piston mode of the related art. An IDT electrode 101, which utilizes the piston mode, of the related art includes first and second busbars 102 and 103. A plurality of first electrode fingers 104 are connected to an inner lateral edge 102a of the first busbar 102. A plurality of second electrode fingers 105 are connected to an inner lateral edge 103a of the second busbar 103. Large-width portions 104a are provided at the tips of the first electrode fingers 104. Large-width portions 105a are provided at the tips of the second electrode fingers 105. Here, the inner lateral edges 102a and 103a of the first and second busbars 102 and 103 extend parallel or substantially parallel to the elastic wave propagation direction. Therefore as illustrated in FIG. 3, low acoustic velocity portions 101B1 and 101B2 are provided at both sides of an IDT center portion 101A in the electrode finger direction. In addition, a high acoustic velocity portion 101C1 is provided outside the low acoustic velocity portion 101B1 and a high acoustic velocity portion 101C2 is provided outside the low acoustic velocity portion 101B2 in the electrode finger direction. Therefore, the piston mode is able to be utilized, similarly to as in the above-described preferred embodiment. Here, the inner lateral edges 102a and 103a of the first and second busbars 102 and 103 extend parallel or substantially parallel to the elastic wave propagation direction. Therefore, the width, that is, the electrode finger direction dimension, of the high acoustic velocity portion 101C1 and the high acoustic velocity portion 101C2 are constant in the elastic wave propagation direction.

Figure 4:
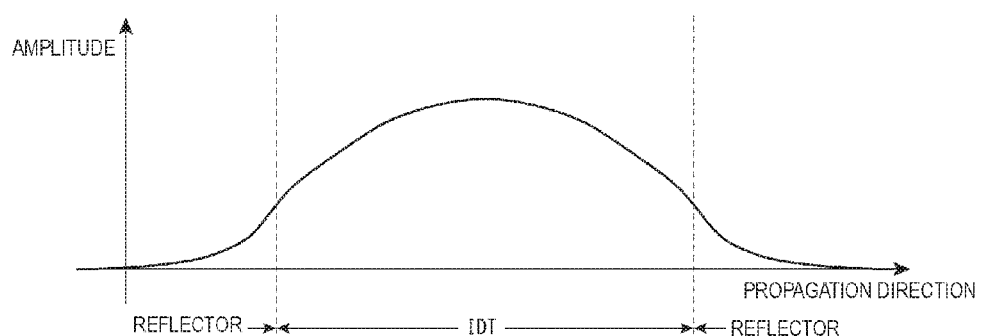
FIG. 4 illustrates the relationship between portions of the elastic wave device of the related art arranged in an elastic wave propagation direction and amplitude.

FIG. 4 illustrates the relationship between portions of the elastic wave device of the related art arranged along the elastic wave propagation direction and amplitude, the elastic wave device being provided with reflectors on both sides of the IDT electrode 101. As is clear from FIG. 4, the amplitude is largest in the center of the IDT electrode 101 and becomes increasingly smaller toward the reflectors. That is, it is clear that the amplitude is sufficiently small at the end portions of the IDT electrode 101 in the elastic wave propagation direction.

Figure 5:
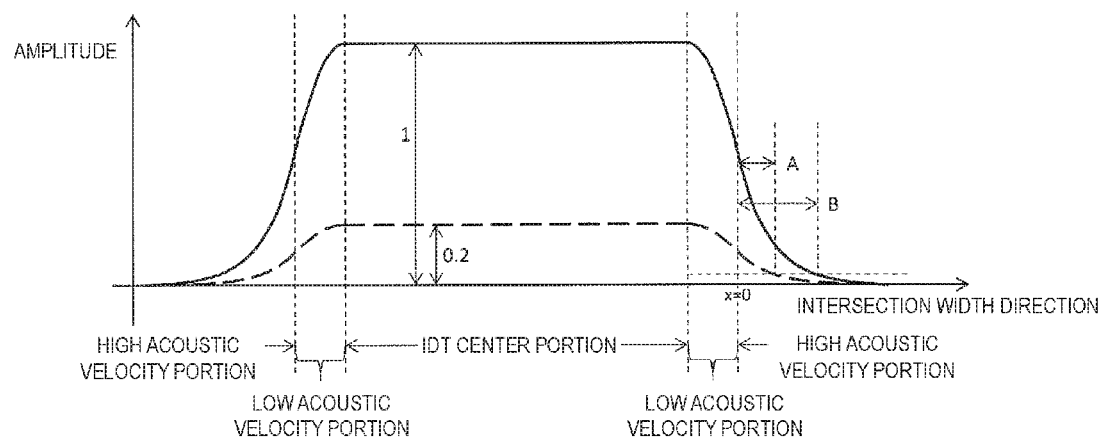
FIG. 5 illustrates the changes in amplitude that occur in the respective portions in the electrode finger direction in the center of an IDT electrode in the elastic wave propagation direction and near one end of the IDT electrode in the elastic wave propagation direction in the elastic wave device of the related art.

On the other hand, FIG. 5 illustrates changes in amplitude that occur in respective portions of the elastic wave device of the related art in the electrode finger direction, reflectors being located on both sides of the IDT electrode 101 illustrated in FIG. 3. A solid line in FIG. 5 represents the changes in amplitude that occur along a single dot chain line X1-X1 in FIG. 3, i.e., in a portion that extends through the center of the IDT electrode 101 in the elastic wave propagation direction. In addition, a broken line represents the changes in amplitude that occur in a portion that extends along a single-dot chain line X2-X2 in FIG. 3. In other words, the changes in amplitude that occur in an end portion of the IDT electrode 101 in the elastic wave propagation direction are illustrated.

As is clear from FIG. 5, in both the center and the end portion in the elastic wave propagation direction, the amplitude is large in the IDT center portion 101A, is attenuated as one moves toward the outside in the low acoustic velocity portions 101B1 and 101B2, and is then attenuated such that the amplitude becomes substantially zero at the outer sides of the high acoustic velocity portions 101C1 and 101C2 in the electrode finger direction. In addition, as is clear from comparing the solid line and the broken line of FIG. 5, the amplitude is smaller in the end portion of the IDT electrode 101 in the elastic wave propagation direction than in the center of the IDT electrode 101 in the elastic wave propagation direction.

Therefore, since the amplitude is sufficiently small in the end portions of the IDT electrode 101 in the elastic wave propagation direction, it is clear that loss is unlikely to worsen when the widths of the high acoustic velocity portions 101C1 and 101C2 are made smaller. In other words, the amplitude is able to be made substantially 0 in the high acoustic velocity portions by making the width of the high acoustic velocity portions be a width B in the center of the IDT electrode 101 in the elastic wave propagation direction as illustrated by the solid line in FIG. 5. In contrast, the amplitude is able to be made substantially zero at the outer edges of the high acoustic velocity portions 101C1 and 101C2 at the end of the IDT electrode 101 in the elastic wave propagation direction as illustrated by the broken line even when the widths of the high acoustic velocity portions 101C1 and 101C2 have been made smaller at a width A.

Therefore, it is clear that, since the amplitude is relatively small at the ends of the IDT electrode in the elastic wave propagation direction as described above, the areas of the end portions are able to be made smaller without increasing loss even when the widths of the high acoustic velocity portions are reduced.

In other words, in the IDT electrode 3 used in this preferred embodiment illustrated in FIG. 1A, although the widths of the high acoustic velocity portions 3C1 and 3C2 are smaller in the end portions of the IDT electrode 3 in the elastic wave propagation direction than in the center of the IDT electrode 3 in the elastic wave propagation direction, size reduction is able to be achieved without incurring an increase in loss for the reason described above.

In addition, in the portions where the widths of the high acoustic velocity portions 3C1 and 3C2 are smaller, the dimensions of the plurality of first electrode fingers 7 and the plurality of second electrode fingers 8 in the high acoustic velocity portions 3C1 and 3C2 become smaller. Therefore, the resistance of the electrode fingers consequently becomes smaller, and loss is also reduced for the same reason. It is preferable that the dimensions of the high acoustic velocity portions 3C1 and 3C2 in the electrode finger direction be small in the end portions of the IDT electrode 3 in the elastic wave propagation direction. However, it is preferable that the smallest width of the high acoustic velocity portions 3C1 and 3C2 be at least about 0.3 times the largest width of the high acoustic velocity portions 3C1 and 3C2. If the width of the high acoustic velocity portions is less than about 0.3 times, then it may not be possible to make the amplitude of an elastic wave at the outer ends of the high acoustic velocity portions sufficiently small and the elastic wave may leak in the busbar direction and lead to worsening of loss of the device. This will be described using a specific example below.

As described above, the relationship between the portions located along the elastic wave propagation direction and amplitude illustrated in FIG. 4 was obtained for a structure in which reflectors are located on both sides of the IDT electrode 101 illustrated in FIG. 3. As a result, as illustrated in FIG. 5, it is clear that the amplitude in the center of the IDT electrode in the intersection width direction in an end portion of the IDT electrode in the elastic wave propagation direction was about 0.2 times the amplitude in the center of the IDT electrode in the intersection width direction in the center of the IDT electrode in the elastic wave propagation direction. The number of pairs of electrode fingers of the IDT electrode was 150, the number of electrode fingers of the reflectors was 20, the piezoelectric substrate was 128° Y—XLiNbO$_3$, and the IDT electrode had a structure of Ti(0.005λ)/AlCu(0.07λ)/Ti(0.005λ)/Pt(0.017λ)/NiCr (0.005λ) from the top. Here, the quantities enclosed by ( ) indicate thicknesses, where λ is the wavelength determined by the pitch of the electrode fingers of the IDT electrode. In addition, a SiO$_2$ film having a thickness of about 0.3λ was provided so as to cover the IDT electrode.

Here, the amplitude of an elastic wave inside a high acoustic velocity portion is exponentially attenuated toward the outside of the high acoustic velocity portion in the intersection width direction. Provided that the amplitude at the outer side of the high acoustic velocity portion is about 1/10 or less the amplitude at the inside end of the high acoustic velocity portion in the central portion of the IDT electrode in the elastic wave propagation direction, it is considered that the loss of the device will not be affected and therefore the width of the high acoustic velocity portions should at least be a width at which this value occurs. Therefore, a ratio A/B of about 0.3 is obtained between a high acoustic velocity portion width B, which is a width needed for the amplitude at the outer side of a high acoustic velocity portion in the center portion of the IDT electrode in the elastic wave propagation direction to become about 1/10 the amplitude at the inner end side of the high acoustic velocity portion in the center portion of the IDT electrode in the elastic wave propagation direction, and a high acoustic velocity portion width A, which is a width needed for the amplitude at the outer side of the high acoustic velocity portion at an end of the IDT electrode in the elastic wave propagation direction to become about 1/10 the amplitude at the inner end side of the high acoustic velocity portion in the center portion of the IDT electrode in the elastic wave propagation direction.

Therefore, it is clear that it is preferable that the width of the high acoustic velocity portion in the end portions of the IDT electrode in the elastic wave propagation direction be at least about 0.3 times the width of the high acoustic velocity portion in the center of the IDT electrode in the elastic wave propagation direction.

Figure 6:
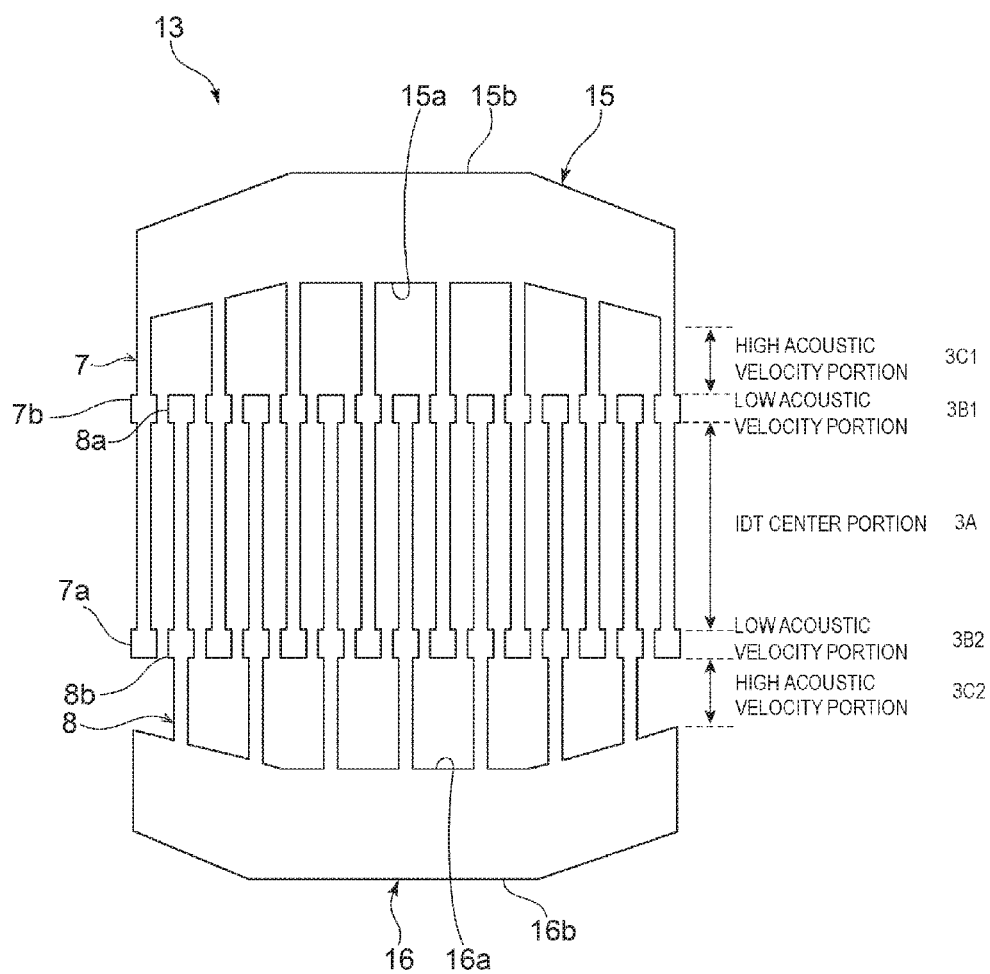
FIG. 6 is a schematic plan view illustrating an IDT electrode of an elastic wave device according to a second preferred embodiment of the present invention.

FIG. 6 is a schematic plan view illustrating an IDT electrode used in an elastic wave device according to a second preferred embodiment of the present invention. An IDT electrode 13 includes portions where the widths of high acoustic velocity portions 3C1 and 3C2 are constant in the elastic wave propagation direction. More specifically, an inner lateral edge 15a of a first busbar 15 includes a portion that extends parallel or substantially parallel to the elastic wave propagation direction in the center in the elastic wave propagation direction and that includes inclined portions that gradually approach a second busbar 16 on both sides of the portion that extends parallel or substantially parallel to the elastic wave propagation direction. An inner lateral edge 16a of the second busbar 16 is configured in the same way. Therefore, the widths of the high acoustic velocity portions 3C1 and 3C2 are constant across a certain length in the center of the IDT electrode 13 in the elastic wave propagation direction and then become smaller as one moves toward the ends of the IDT electrode in the elastic wave propagation direction on both sides of the center in the elastic wave propagation direction.

Similarly, outer lateral edges 15b and 16b of the busbars 15 and 16 also include portions that are parallel or substantially parallel to the elastic wave propagation direction in the center in the elastic wave propagation direction. Portions on both sides of the parallel or substantially parallel portions are inclined so as to approach the second busbar 16 or the first busbar 15 as one moves toward the end portions in the elastic wave propagation direction.

Apart from including portions where the widths of the high acoustic velocity portions 3C1 and 3C2 are constant in the elastic wave propagation direction as described above, the rest of the second preferred embodiment is the same as the first preferred embodiment. Therefore, the second preferred embodiment is also able to achieve a reduction in size without incurring an increase in loss similarly to as in the first preferred embodiment. Furthermore, loss is able to be reduced by reducing the electrode finger resistance.

As is clear from the second preferred embodiment, in a preferred embodiment of the present invention, the high acoustic velocity portions may include portions where the width is constant in the elastic wave propagation direction. In addition, the widths of the high acoustic velocity portions are not limited to changing in a continuous manner and may instead change in a step-like manner.

In addition, in the first preferred embodiment, an elastic wave resonator in which the reflectors 4A and 4B are provided on both sides of the IDT electrode 3 has been described, but preferred embodiments of the present invention may be applied to another type of elastic wave device such as an elastic wave filter. That is, preferred embodiments of the present invention can be applied to a suitable elastic wave device that includes one or more IDT electrodes.

Figure 10A:
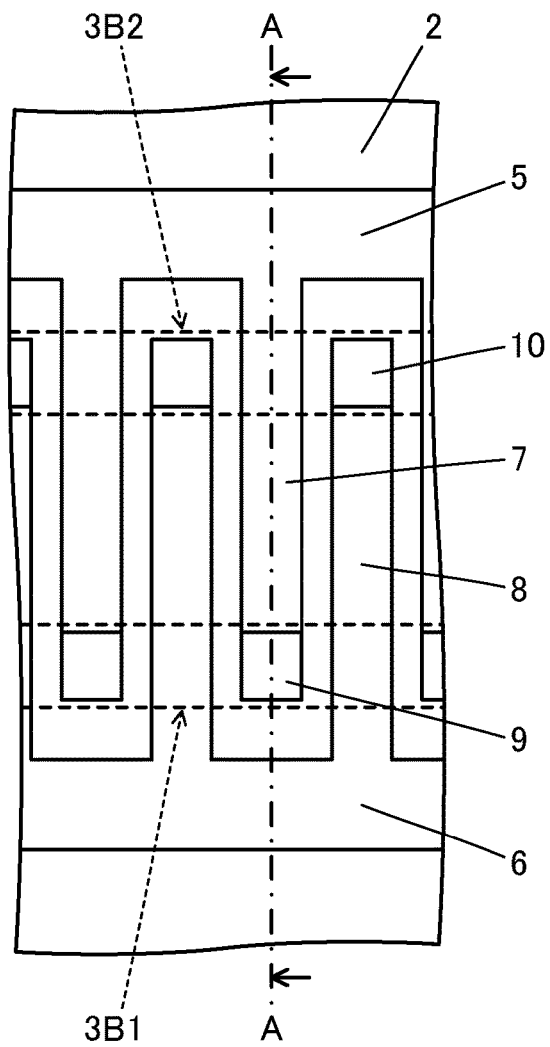
FIG. 10A is a schematic partially cut away plan view of an IDT electrode for explaining another modification of the first preferred embodiment of the present invention and FIG. 10B is a cross-sectional view taken along line A-A in FIG. 10A.
Figure 10B:
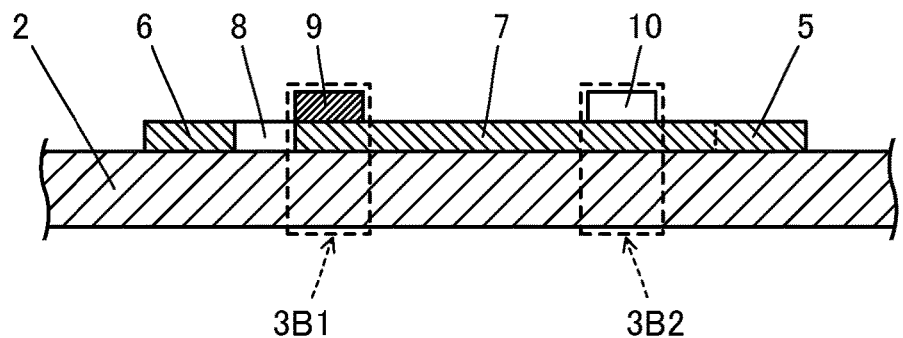

Furthermore, in the first preferred embodiment, the low acoustic velocity portions 3B1 and 3B2 are formed preferably by providing the large-width portions 7a and 8a at the tips of the first and second electrode fingers 7 and 8. The low acoustic velocity portions may be instead formed by stacking dielectric films, which define and function as mass-adding films 9 and 10 as shown in FIG. 10A and FIG. 10B, on the leading ends of the first and second electrode fingers, for example. Alternatively, the acoustic velocity may be increased in the IDT center portion 3A by stacking dielectric films that act so as to increase the acoustic velocity in the IDT center portion 3A between the low acoustic velocity portions or by forming an electrode finger portion that defines an IDT center portion on a film that increases the acoustic velocity. In this case, the low acoustic velocity portions 3B1 and 3B2 define low acoustic velocity portions 3B1 and 3B1 that have relatively low acoustic velocities.

A configuration in which low acoustic velocity portions are provided on both sides of the IDT center portion 3A as described above can be modified similarly to various elastic wave devices that utilize the piston mode known in the related art.

Figure 7:
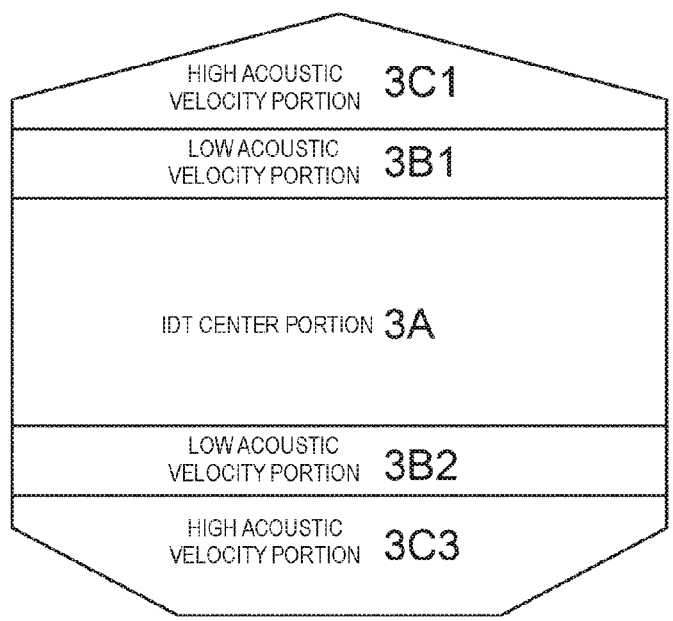
FIG. 7 is a schematic plan view illustrating the arrangement of the respective acoustic velocity portions of an IDT electrode for explaining a modification of the first preferred embodiment of the present invention.
Figure 8:
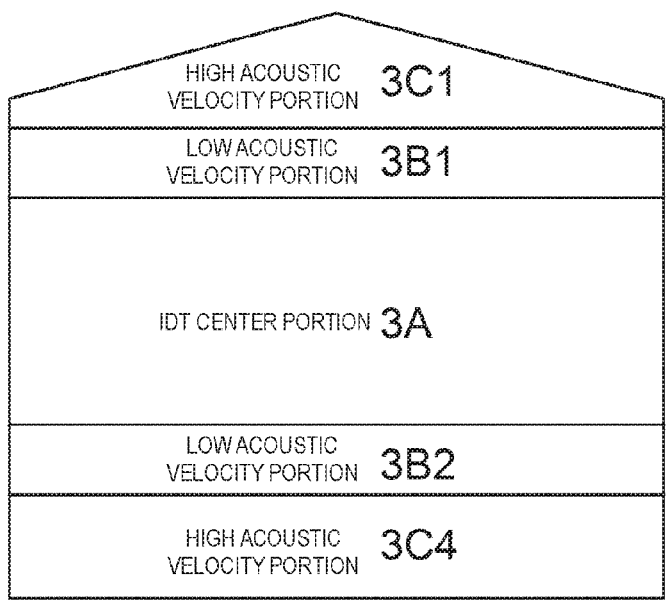
FIG. 8 is a schematic plan view illustrating the arrangement of the respective acoustic velocity portions of an IDT electrode for explaining another modification of the first preferred embodiment of the present invention.

In addition, so long as widths are secured for the high acoustic velocity portions such that the amplitude of an elastic wave is sufficiently attenuated across the entire extent of the IDT electrode in the elastic wave propagation direction, the portions of the IDT electrode on one side in the intersection width direction and on the opposite side in the intersection width direction do not necessarily have to be symmetrical. For example, one high acoustic velocity portion 3C1 and another high acoustic velocity portion 3C3 may be asymmetrical as in the modification illustrated in FIG. 7. In addition, weighting may be applied to one high acoustic velocity portion 3C1 and may not be applied to the other high acoustic velocity portion 3C4 as in the modification illustrated in FIG. 8.

Figure 9:
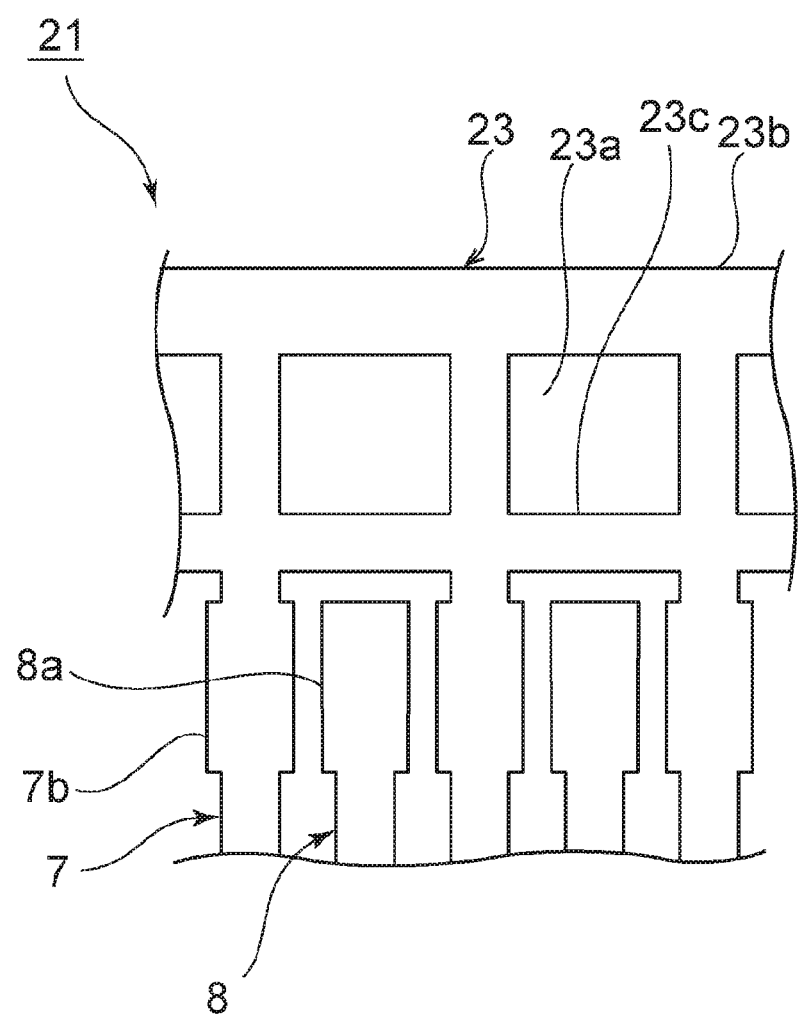
FIG. 9 is a schematic partially cut away plan view of an IDT electrode for explaining yet another modification of the first preferred embodiment of the present invention.

FIG. 9 is a schematic partially cut away plan view of an IDT electrode of yet another modification of the first preferred embodiment. In an IDT electrode 21 of this modification, a busbar 23 includes openings 23a. The portion outside the openings 23a is an outer busbar portion 23b and the portion inside the openings 23a is an inner busbar portion 23c. A high acoustic velocity portion is defined by the openings 23a provided in the busbar 23. In addition, a low acoustic velocity portion includes the inner busbar portion 23c located closer to the inside in the intersection width direction than the openings. Thus, the high acoustic velocity portions and the low acoustic velocity portions may include a variety of shapes in various preferred embodiments of the present invention.

Any suitable elastic wave such as a surface acoustic wave, a boundary acoustic wave or a plate wave may be used as the elastic wave used in the elastic wave device according to various preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate; and
an IDT electrode on the piezoelectric substrate; wherein
the IDT electrode includes a plurality of first electrode fingers and a plurality of second electrode fingers inserted between the plurality of first electrode fingers;
low acoustic velocity portions, in which an acoustic velocity of a propagating elastic wave is lower than in a center region in an electrode finger direction which is a direction in which the pluralities of first and second electrode fingers extend, are provided on both sides of the center region in the electrode finger direction and high acoustic velocity portions, in which an acoustic velocity of a propagating elastic wave is higher than in the center region, are provided closer to an outside than the low acoustic velocity portions in the electrode finger direction; and
a width of the high acoustic velocity portions is a dimension of the high acoustic velocity portions in the electrode finger direction;
the width of the high acoustic velocity portions in end portions of the IDT electrode in an elastic wave propagation direction is relatively smaller than the width of the high acoustic velocity portions in a center of the IDT electrode in the elastic wave propagation direction.

2. The elastic wave device according to claim 1, further comprising a portion where the width of the high acoustic velocity portions is constant in the center of the IDT electrode in the elastic wave propagation direction.

3. The elastic wave device according to claim 1, wherein the width of the high acoustic velocity portions gradually decreases in a direction from the center of the IDT electrode in the elastic wave propagation direction toward the end portions of the IDT electrode in the elastic wave propagation direction.

4. The elastic wave device according to claim 1, wherein the width of the high acoustic velocity portions in the end portions of the IDT electrode in the elastic wave propagation direction is at least about 0.3 times the width of the high acoustic velocity portions in the center of the IDT electrode in the elastic wave propagation direction.

5. The elastic wave device according to claim 1, wherein the low acoustic velocity portions include large-width portions in which the width of the electrode fingers is larger than in the center region.

6. The elastic wave device according to claim 1, wherein the low acoustic velocity portions include a mass-adding film on the first and second electrode fingers.

7. The elastic wave device according to claim 1, wherein, in the IDT electrode, a first busbar is electrically connected to the plurality of first electrode fingers, a second busbar is electrically connected to the plurality of second electrode fingers, and a region located between an intersection region, in which the first and second electrode fingers overlap in the elastic wave propagation direction, and the first busbar, and a region located between the intersection region and the second busbar define the high acoustic velocity portions.

8. The elastic wave device according to claim 1, wherein the high acoustic velocity portions include openings in the busbars.

9. The elastic wave device according to claim 8, wherein the busbars each include an inner busbar portion that is located closer to the center in an intersection width direction than a portion of the busbar where the opening is provided, and the inner busbar portion defines the low acoustic velocity portion.

10. The elastic wave device according to claim 1, further comprising reflectors provided on both sides of the IDT electrode.

11. The elastic wave device according to claim 7, wherein an inner lateral edge of the first busbar is to be closer to the second busbar moving from the center of the IDT electrode in the elastic wave propagation direction toward the end portions of the IDT electrode in the elastic wave propagation direction.

12. The elastic wave device according to claim 7, wherein inner lateral edge of the second busbar is inclined to be closer to the first busbar moving from the center toward the two end portions in the elastic wave propagation direction.

13. The elastic wave device according to claim 7, wherein outer lateral edges of the first and second busbars are parallel or substantially parallel to inner lateral edges of the first and second busbars.

14. The elastic wave device according to claim 1, wherein the elastic wave device is structured to use the piston mode.

15. The elastic wave device according to claim 7, wherein an inner lateral edge of the first busbar includes a portion that extends parallel or substantially parallel to the elastic wave propagation direction in the center in the elastic wave propagation direction and includes inclined portions that approach the second busbar on both sides of the portion that extends parallel or substantially parallel to the elastic wave propagation direction.

16. The elastic wave device according to claim 7, wherein lateral edges of the first and second busbars include portions that are parallel or substantially parallel to the elastic wave propagation direction in the center of the elastic wave propagation direction.

17. The elastic wave device according to claim 1, wherein the elastic wave device is one of a surface acoustic wave device, a boundary acoustic wave device and a plate wave device.

* * * * *